(12) United States Patent
Singh et al.

(10) Patent No.: US 9,780,223 B2
(45) Date of Patent: Oct. 3, 2017

(54) GALLIUM ARSENIDE BASED MATERIALS USED IN THIN FILM TRANSISTOR APPLICATIONS

(71) Applicant: Applied Materials, Inc., Santa Clara, CA (US)

(72) Inventors: Kaushal K. Singh, Santa Clara, CA (US); Robert Jan Visser, Menlo Park, CA (US); Bhaskar Kumar, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/210,637

(22) Filed: Jul. 14, 2016

(65) Prior Publication Data
US 2016/0322509 A1 Nov. 3, 2016

Related U.S. Application Data

(62) Division of application No. 13/250,766, filed on Sep. 30, 2011, now abandoned.
(Continued)

(51) Int. Cl.
*H01L 21/00* (2006.01)
*H01L 29/786* (2006.01)
(Continued)

(52) U.S. Cl.
CPC ........ *H01L 29/78681* (2013.01); *B82Y 10/00* (2013.01); *B82Y 30/00* (2013.01);
(Continued)

(58) Field of Classification Search
None
See application file for complete search history.

(56) References Cited

U.S. PATENT DOCUMENTS

| 4,307,680 A * | 12/1981 | Haigh | ............ C30B 19/04 117/61 |
|---|---|---|---|
| 4,923,524 A | 5/1990 | Kiss | |

(Continued)

FOREIGN PATENT DOCUMENTS

| EP | 2116899 A2 | 11/2009 |
|---|---|---|
| JP | H05503319 A | 6/1993 |

(Continued)

OTHER PUBLICATIONS

PCT international search report and written opinion of PCT/US2011/054301 dated Apr. 24, 2012.
(Continued)

*Primary Examiner* — Cory Eskridge
(74) *Attorney, Agent, or Firm* — Patterson + Sheridan LLP

(57) ABSTRACT

Embodiments of the invention provide a method of forming a group III-V material utilized in thin film transistor devices. In one embodiment, a gallium arsenide based (GaAs) layer with or without dopants formed from a solution based precursor may be utilized in thin film transistor devices. The gallium arsenide based (GaAs) layer formed from the solution based precursor may be incorporated in thin film transistor devices to improve device performance and device speed. In one embodiment, a thin film transistor structure includes a gate insulator layer disposed on a substrate, a GaAs based layer disposed over the gate insulator layer, and a source-drain metal electrode layer disposed adjacent to the GaAs based layer.

13 Claims, 6 Drawing Sheets

Related U.S. Application Data

(60) Provisional application No. 61/468,918, filed on Mar. 29, 2011, provisional application No. 61/452,801, filed on Mar. 15, 2011, provisional application No. 61/388,943, filed on Oct. 1, 2010.

(51) Int. Cl.

| | | |
|---|---|---|
| *B82Y 30/00* | (2011.01) | |
| *C23C 16/30* | (2006.01) | |
| *C23C 16/56* | (2006.01) | |
| *H01L 21/02* | (2006.01) | |
| *H01L 31/0224* | (2006.01) | |
| *H01L 31/0352* | (2006.01) | |
| *H01L 31/072* | (2012.01) | |
| *H01L 31/075* | (2012.01) | |
| *H01L 31/18* | (2006.01) | |
| *H01L 51/42* | (2006.01) | |
| *B82Y 10/00* | (2011.01) | |
| *H01L 21/324* | (2006.01) | |
| *H01L 27/12* | (2006.01) | |
| *H01L 29/207* | (2006.01) | |
| *H01L 29/45* | (2006.01) | |
| *H01L 29/66* | (2006.01) | |
| *H01L 51/00* | (2006.01) | |

(52) U.S. Cl.
CPC ............ *C23C 16/301* (2013.01); *C23C 16/56* (2013.01); *H01L 21/0237* (2013.01); *H01L 21/0262* (2013.01); *H01L 21/02491* (2013.01); *H01L 21/02546* (2013.01); *H01L 21/02576* (2013.01); *H01L 21/02579* (2013.01); *H01L 21/02601* (2013.01); *H01L 21/02628* (2013.01); *H01L 21/02631* (2013.01); *H01L 21/3245* (2013.01); *H01L 27/127* (2013.01); *H01L 27/1225* (2013.01); *H01L 29/207* (2013.01); *H01L 29/454* (2013.01); *H01L 29/66742* (2013.01); *H01L 29/78618* (2013.01); *H01L 29/78696* (2013.01); *H01L 31/022425* (2013.01); *H01L 31/035227* (2013.01); *H01L 31/072* (2013.01); *H01L 31/075* (2013.01); *H01L 31/184* (2013.01); *H01L 31/1864* (2013.01); *H01L 51/424* (2013.01); *H01L 51/0048* (2013.01); *Y02E 10/544* (2013.01); *Y02E 10/548* (2013.01); *Y02E 10/549* (2013.01); *Y02P 70/521* (2015.11)

(56) References Cited

U.S. PATENT DOCUMENTS

| | | |
|---|---|---|
| 4,928,154 A | 5/1990 | Umeno et al. |
| 4,975,299 A | 12/1990 | Mir et al. |
| 5,084,128 A | 1/1992 | Baker |
| 6,071,780 A | 6/2000 | Okamoto et al. |
| 6,839,507 B2 | 1/2005 | Adams et al. |
| 2001/0049152 A1 | 12/2001 | Taniguchi et al. |
| 2002/0050288 A1 | 5/2002 | Suzuki |
| 2002/0145143 A1 | 10/2002 | Kawasaki et al. |
| 2004/0016965 A1 | 1/2004 | Ui et al. |
| 2009/0001504 A1 | 1/2009 | Takei et al. |
| 2010/0012170 A1 | 1/2010 | Varonides et al. |
| 2010/0044696 A1 | 2/2010 | Cheng et al. |
| 2010/0096004 A1 | 4/2010 | Hu et al. |
| 2010/0096634 A1 | 4/2010 | Park et al. |

FOREIGN PATENT DOCUMENTS

| | | |
|---|---|---|
| JP | 10092747 A | 4/1998 |
| JP | 2006287070 A | 10/2006 |
| JP | 2007096055 A | 4/2007 |
| JP | 2008517468 A | 5/2008 |
| TW | 200814330 A | 3/2008 |
| WO | 9106688 A1 | 5/1991 |

OTHER PUBLICATIONS

PCT international search report and written opinion of PCT/US2011/054306 dated Apr. 24, 2012.
Joanna Prazmowska et al. "Solar cells conversion efficiency enhancement techniques," Optica Applicata, 2007 vol. XXXVII, No. 1-2, p. 93-99.
Notice of Rejection from Japanese Patent Application No. 2013-531928 dated Feb. 16, 2016 (5 pgs.) with translation (4 pgs.).
Office Action from Taiwan Patent Application No. 100135551 dated Jul. 6, 2016.

* cited by examiner

GALLIUM ARSENIDE BASED MATERIALS USED IN THIN FILM TRANSISTOR APPLICATIONS

CROSS-REFERENCE TO RELATED APPLICATIONS

This application is a divisional application of U.S. patent application Ser. No. 13/250,766, filed Sep. 30, 2011, which claims benefit of U.S. Provisional Application Ser. No. 61/388,943 filed Oct. 1, 2010, U.S. Provisional Application Ser. No. 61/452,801 filed Mar. 15, 2011 and U.S. Provisional Application Ser. No. 61/468,918, filed Mar. 29, 2011, all of which are incorporated by reference in their entirety.

This application is also related to U.S. patent application Ser. No. 13/250,748, now U.S. Pat. No. 8,846,437 entitled "High Efficiency Thin Film Transistor With Gallium Arsenide Absorber Layer", filed Sep. 30, 2011, which is herein incorporated by reference.

BACKGROUND OF THE INVENTION

Field of the Invention

Embodiments of the present invention generally relate to methods of manufacturing thin film transistor devices. More particularly, embodiments of the present invention relate to a group III-V based material utilized in thin film transistor devices.

Description of the Related Art

Plasma display panels and liquid crystal displays are frequently used for flat panel displays. Liquid crystal displays (LCD) generally contain two glass substrates joined together with a layer of a liquid crystal material sandwiched there between. The glass substrate may be a semiconductor substrate, or may be a transparent substrate such as a glass, quartz, sapphire, or a clear plastic film. The LCD may also contain light emitting diodes for back lighting.

As the resolution requirements for liquid crystal displays increase, it has become desirable to control a large number of separate areas of the liquid crystal cell, called pixels. In a modern display panel, more than 1,000,000 pixels may be present. At least the same number of transistors is formed on the glass substrate so that each pixel can be switched between an energized and de-energized state relative to the other pixels disposed on the substrate.

In recent years, low temperature polysilicon (LTPS) TFT and micro-crystalline silicon TFT have been developed to offer an operation speed with a fast speed. TFT devices typically include MOS devices built with a source region, semiconductor (e.g., or called a channel region), and drain region formed on an optically transparent substrate with or without an optional dielectric layer disposed thereon. Subsequently, a gate dielectric layer is then deposited on top of the source region, semiconductor region (e.g., or called a channel region) and drain region isolate a gate electrode from the semiconductor (e.g., or called a channel region), source and drain regions. The gate electrode is formed on top of the gate dielectric layer. The performance of a TFT device dependent on the quality of the films that are deposited to form the MOS structure. The key performance elements of a MOS device are the qualities of the semiconductor layer (e.g., or called a channel layer), the gate dielectric layer, and the semiconductor layer (e.g., or called a channel layer) and gate dielectric layer interface. The quality of the semiconductor layer (e.g., or called a channel region) has received a lot of attention in recent years.

Therefore, there is a need for forming a semiconductor layer with improved film qualities to provide a stable and reliable device performance.

SUMMARY OF THE INVENTION

Embodiments of the invention provide a method of forming a group III-V based material utilized in thin film transistor devices. In one embodiment, a gallium arsenide based (GaAs) layer with or without dopants formed from a solution based precursor may be utilized in thin film transistor devices. The gallium arsenide based (GaAs) layer formed from the solution based precursor may be incorporated in thin film transistor devices to improve device performance and device speed. In one embodiment, a thin film transistor structure includes a gate insulator layer disposed on a substrate, a GaAs based layer disposed over the gate insulator layer, and a source-drain metal electrode layer disposed adjacent to the GaAs based layer.

In another embodiment, a method of forming a thin film transistor structure includes providing a substrate having a dielectric layer disposed thereon into a processing chamber, supplying a GaAs containing precursor disposed in a solvent to the processing chamber, evaporating the GaAs containing precursor solvent in the processing chamber to form a GaAs based layer on the substrate, and forming a source-drain metal electrode layer adjacent to the GaAs based layer to form a thin film transistor structure.

In yet another embodiment, a thin film transistor device includes a method for forming a GaAs based material in a thin film transistor structure further includes providing a substrate having a dielectric layer formed thereon, forming a semiconductor layer disposed on the dielectric layer, wherein the semiconductor layer is fabricated from a solution based GaAs based layer, and forming a source-drain metal electrode layer adjacent to the semiconductor layer.

In still another embodiment, a method for forming a GaAs based material on a substrate includes providing a substrate into a electrohydrodynamic jet system, and printing a plurality of GaAs droplets onto the substrate, wherein the GaAs droplets are supplied from a solution based GaAs precursor disposed in the system.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the disclosure provide methods of forming group III-V based materials that may be utilized in thin film transistor devices. In one embodiment, the group III-V materials that may be utilized to form the thin film transistor devices includes a gallium arsenide (GaAs) based material. The gallium arsenide (GaAs) based material may be fabricated from a GaAs pre-engineering solution. The gallium arsenide (GaAs) based material may also be used in photodiodes, semiconductor diode, light-emitting diode (LED), or organic light-emitting diode (OLED), or other suitable display applications. The gallium arsenide (GaAs) based material provides high film mobility and stability and low film leakage, thereby efficiently enhancing the electrical performance of transistor devices. It is noted that the gallium arsenide (GaAs) based material may be used in other suitable devices beyond the application noted above.

Figure 1:
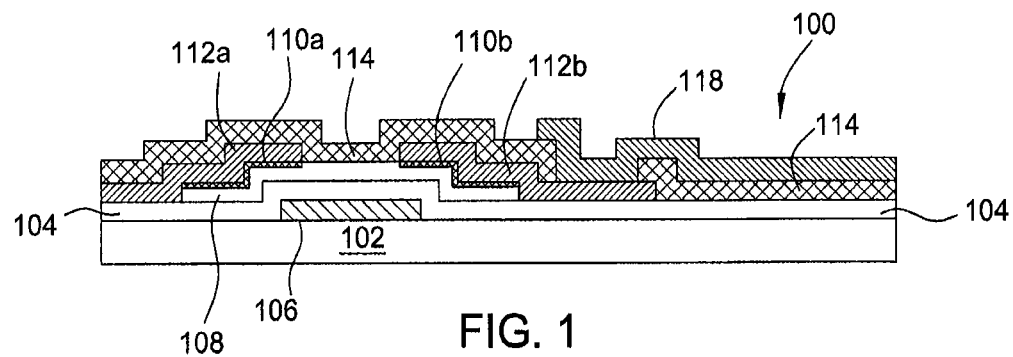
FIG. 1-6 are cross sectional views of various embodiments of thin film transistor device structure.

FIG. 1 depicts a bottom gate structure thin film transistor (TFT) device 100 according to one embodiment of the present disclosure. The device 100 includes a gate electrode layer 106 disposed on a substrate 102 covered with a gate insulator layer 104. A semiconductor layer 108 (e.g., or called a semiconductor active layer, an active layer or a channel layer), conventionally often made from an amorphous silicon layer or a low temperature polysilicon (LTPS) layer, is disposed over the gate insulator layer 104. A thin doped semiconductor layer of n-type or p-type layer 110a, 110b is disposed over the semiconductor layer 108. After formation of the doped semiconductor layer 110a, 110b, a source-drain metal electrode layer 112a, 112b is then disposed thereon and a passivation layer 114 is then subsequently formed thereon to form the thin film transistor device 100. Instead of using conventional silicon containing layers for manufacturing the semiconductor layer 108, a group III-V material may be used to form as may be used to form as the semiconductor layer 108 and the thin doped semiconductor layer 110a, 110b in the thin film transistor 100. In example of the group III-V material is a gallium arsenide (GaAs) based material. It is believed that gallium arsenide (GaAs) based material can provide a high electron mobility and wide band gap so as to improve the transistor device performance and speed. Accordingly, using gallium arsenide (GaAs) based material as the semiconductor layer 108 and the thin doped semiconductor layer 110a, 110b is believed to provide the thin film transistor 100 a good device performance. Details regarding the manufacture of the gallium arsenide (GaAs) based material or doped gallium arsenide (GaAs) based material will be discussed below with referenced to FIGS. 7-9.

In one embodiment, the substrate 102 may be any one of glass substrate, plastic substrate, polymer substrate, metal substrate, singled substrate, roll-to-roll substrate, or other suitable transparent substrate suitable for forming a thin film transistor thereon. The gate electrode layer 106 may be fabricated from any suitable metallic materials, such as indium tin oxide (ITO), tin oxide (SnO), indium zinc oxide (IZO), indium tin zinc oxide (ITZO), aluminum (Al), tungsten (W), chromium (Cr), germanium (Ge), tantalum (Ta), titanium (Ti), gold (Au), alloy of titanium (Ti) and gold (Au), alloy of tantalum (Ta) and gold (Au), alloy of germanium (Ge) and gold (Au), molybdenum (Mo), InGaZnO, InGaZnON, ZnO, ZnON, ZnSnO, CdSnO, GaSnO, TiSnO, CuAlO, SrCuO, LaCuOS, GaN, InGaN, AlGaN or InGaAlN or combination thereof. Suitable materials for the gate insulator layer 104 may be silicon oxide ($SiO_2$), silicon oxynitride (SiON), or silicon nitride (SiN), high-k materials, such as $HfO_2$, or other suitable materials, or the like. The source-drain metal electrode layer 112a, 112b may be fabricated by a metallic material selected from a group consisting of copper (Cu), gold (Au), silver (Ag), aluminum (Al), tungsten (W), molybdenum (Mo), chromium (Cr), tantalum (Ta), cobalt (Co), germanium (Ge), tantalum (Ta), titanium (Ti), gold (Au), alloy of titanium (Ti) and gold (Au), alloy of tantalum (Ta) and gold (Au), alloy of germanium (Ge) and gold (Au), alloy of aluminum (Al) and cobalt (Co), composite layers including a film stack having aluminum layer (Al) sandwiched between molybdenum (Mo), alloys thereof and combination thereof. The passivation layer 114 may be fabricated by dielectric materials including silicon oxide ($SiO_2$), silicon oxynitride (SiON), or silicon nitride (SiN), suitable polymer materials, such as polymethylmethacrylate (PMMA) and the like.

Figure 2:
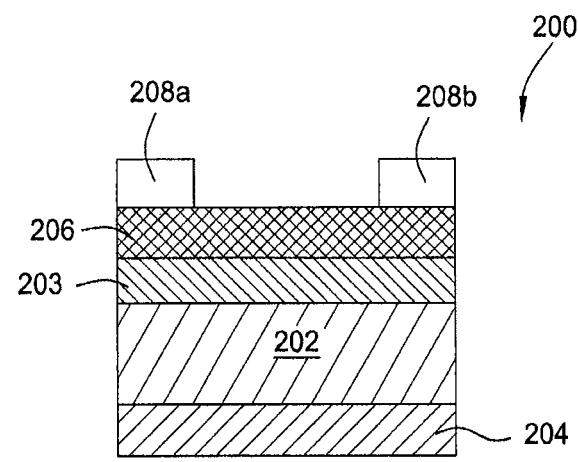

FIG. 2 depicts a top metal gate structure thin film transistor (TFT) device 200 according to one embodiment of the present disclosure. The device 200 includes a metal gate electrode 204 disposed over a backside of a substrate 202. An insulator layer 203 may be formed from an opposite side (e.g., front side) of the substrate 202 from wherein the metal gate electrode 204 is formed. A semiconductor layer 206 (e.g., or called a semiconductor active layer, an active layer or a channel layer), conventionally often made from an amorphous silicon layer or a low temperature polysilicon (LTPS) layer, is disposed over the insulator layer 203. Subsequently, a source-drain metal electrode layer 208a, 208b is then disposed over the semiconductor layer 206 to form the thin film transistor device 200. Instead of using conventional silicon containing layers for manufacturing the semiconductor layer 206, a group III-V material may be used to form as may be used to form as the semiconductor layer 206 in the thin film transistor 200. In example of the group III-V material is a gallium arsenide (GaAs) based material. It is believed that gallium arsenide (GaAs) based material can provide a high electron mobility and wide band gap so as to improve the transistor device performance and speed. Accordingly, using gallium arsenide (GaAs) based material as the semiconductor layer 206 is believed to provide the thin film transistor 200 a good device performance may be obtained. Details regarding the manufacture of the gallium arsenide (GaAs) based material or doped gallium arsenide (GaAs) based material will be discussed below with referenced to FIGS. 7-9.

The materials that may be used to form the metal gate electrode 204, the insulator layer 203, and the source-drain metal electrode layer 208a, 208b may be similar to the materials utilized to form the metal gate electrode 106, the gate insulator layer 104, and the source-drain metal electrode layer 112a, 112b described above with referenced to FIG. 1.

Figure 3:
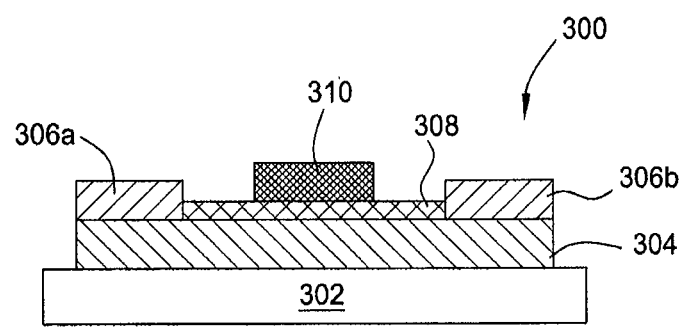

FIG. 3 depicts a thin film transistor (TFT) device 300 according to one embodiment of the present disclosure. The device 300 includes a semiconductor layer 304 (or called a semiconductor active layer, an active layer or a channel layer) disposed over a substrate 302. An insulator layer 308 may be formed over the semiconductor layer 304 in between a patterned source-drain metal electrode layer 306a, 306b. A gate electrode layer 310 is then disposed over the insulator layer 308 to form the thin film transistor device 300. Instead of using conventional silicon containing layers for manufacturing the semiconductor layer 304, a group III-V material may be used to form as may be used to form as the semiconductor layer 304 in the thin film transistor 300. In example of the group III-V material is a gallium arsenide (GaAs) based material. It is believed that gallium arsenide (GaAs) based material can provide a high electron mobility and wide band gap so as to improve the transistor device performance and speed. Accordingly, using gallium arsenide (GaAs) based material as the semiconductor layer 304 is believed to provide the thin film transistor 300 a good device performance. Details regarding the manufacture of the gallium arsenide (GaAs) based material or doped gallium arsenide (GaAs) based material will be discussed below with referenced to FIGS. 7-9.

The materials that may be used to form the metal gate electrode layer 310, the insulator layer 308, and the source-drain metal electrode layer 306a, 306b may be similar to the materials utilized to form the metal gate electrode 106, the gate insulator layer 104, and the source-drain metal electrode layer 112a, 112b described above with referenced to FIG. 1.

Figure 4:
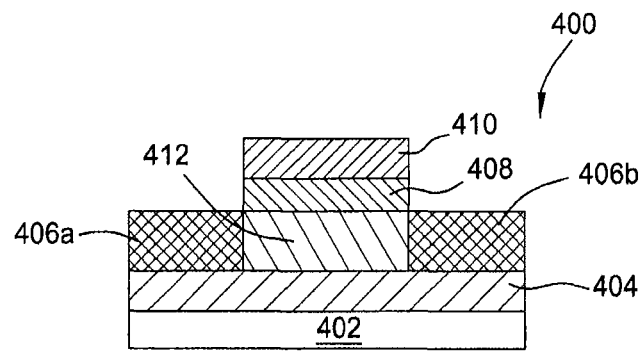

FIG. 4 depicts a thin film transistor (TFT) device 400 according to one embodiment of the present disclosure. The device 400 includes a buffer oxide layer 404 disposed on a substrate 402. A semiconductor layer 412 (e.g., or called a semiconductor active layer, an active layer or a channel layer) is disposed between a patterned source-drain metal electrode layer 406a, 406b. A gate insulator layer 408 is then disposed over the semiconductor layer 412 followed by a metal gate electrode layer 410. Instead of using conventional silicon containing layers for manufacturing the semiconductor layer 412, a group III-V material may be used to form as may be used to form as the semiconductor layer 412 in the thin film transistor 400. In example of the group III-V material is a gallium arsenide (GaAs) based material. It is believed that gallium arsenide (GaAs) based material can provide a high electron mobility and wide band gap so as to improve the transistor device performance and speed. Accordingly, using gallium arsenide (GaAs) based material as the semiconductor layer 412 is believed to provide the thin film transistor device 400 a good device performance. Details regarding the manufacture of the gallium arsenide (GaAs) based material or doped gallium arsenide (GaAs) based material will be discussed below with referenced to FIGS. 7-9.

The materials that may be used to form the metal gate electrode 410, the gate insulator layer 408, and the source-drain metal electrode layer 406a, 406b may be similar to the materials utilized to form the metal gate electrode 106, the gate insulator layer 104, and the source-drain metal electrode layer 112a, 112b described above with referenced to FIG. 1.

Figure 5:
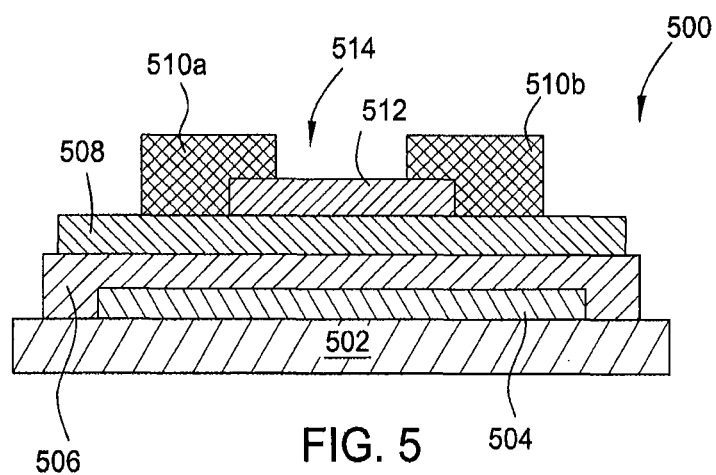

FIG. 5 depicts a thin film transistor (TFT) device 500 according to one embodiment of the present disclosure. The device 500 includes a metal gate electrode layer 504 is disposed over a substrate 502. A gate insulator layer 506 is disposed over the metal gate electrode 504. A semiconductor layer 508 (e.g., or called a semiconductor active layer, an active layer or a channel layer) is disposed over the gate insulator layer 506. Subsequently, a passivation layer 512 is disposed over the semiconductor layer 508 between a patterned source-drain metal electrode layer 510a, 510b. Instead of using conventional silicon containing layers for manufacturing the semiconductor layer 508, a group III-V material may be used to form as may be used to form as the semiconductor layer 508 in the thin film transistor 500. In example of the group III-V material is a gallium arsenide (GaAs) based material. It is believed that gallium arsenide (GaAs) based material can provide a high electron mobility and wide band gap so as to improve the transistor device performance and speed. Accordingly, using gallium arsenide (GaAs) based material as the semiconductor layer 508 is believed to provide the thin film transistor device 500 a good device performance. Details regarding the manufacture of the gallium arsenide (GaAs) based material or doped gallium arsenide (GaAs) based material will be discussed below with referenced to FIGS. 7-9.

The materials that may be used to form the passivation layer 512, the metal gate electrode layer 504, the gate insulator layer 506, and the source-drain metal electrode layer 510a, 510b may be similar to the materials utilized to form the passivation layer 114, the metal gate electrode layer 106, the gate insulator layer 104, and the source-drain metal electrode layer 112a, 112b described above with referenced to FIG. 1.

Figure 6:
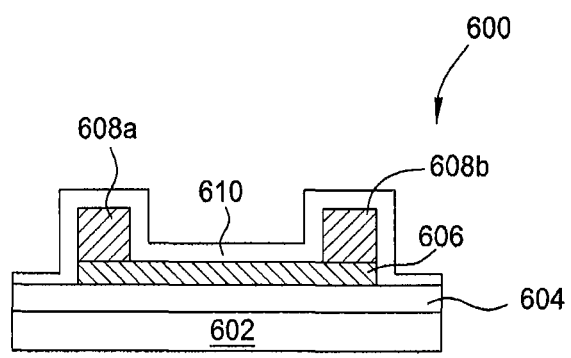

FIG. 6 depicts a thin film transistor (TFT) device 600 according to one embodiment of the present disclosure. The device 600 includes a gate insulator layer 604 disposed over the substrate 602. A semiconductor layer 606 (e.g., or called a semiconductor active layer, an active layer or a channel layer) is disposed on the gate insulator layer 604. A patterned source-drain electrode layer 608a, 608b is then disposed on the semiconductor layer 606. Subsequently, a passivation layer 610 is then disposed on the patterned source-drain electrode layer 608a, 608b. Instead of using conventional silicon containing layers for manufacturing the semiconductor layer 606, a group III-V material may be used to form as may be used to form as the semiconductor layer 606 in the thin film transistor 600. In example of the group III-V material is a gallium arsenide (GaAs) based material. It is believed that gallium arsenide (GaAs) based material can provide a high electron mobility and wide band gap so as to improve the transistor device performance and speed. Accordingly, using gallium arsenide (GaAs) based material as the semiconductor layer 606 is believed to provide the thin film transistor device 600 a greater mobility of electrons and good device performance may be obtained. Details regarding the manufacture of the gallium arsenide (GaAs) based material or doped gallium arsenide (GaAs) based material will be discussed below with referenced to FIGS. 7-9.

The materials that may be used to form the passivation layer 610, the gate insulator layer 604, and the source-drain metal electrode layer 608a, 608b may be similar to the materials utilized to form the passivation layer 114, the metal gate electrode layer 106, the gate insulator layer 104, and the source-drain metal electrode layer 112a, 112b described above with referenced to FIG. 1.

It is noted that FIGS. 1-6 only depict exemplary embodiments of thin film transistors having semiconductor layers that may be formed from a group III-V material, such as a gallium arsenide (GaAs) based material or a doped gallium arsenide (GaAs) based material. Other thin film devices not illustrated here having semiconductor layers, doped semiconductor layers, or other suitable active or non-active layers formed therein may also suitable to be formed as group III-V material according to the methods as described below with referenced to FIGS. 7-9.

Figure 7:
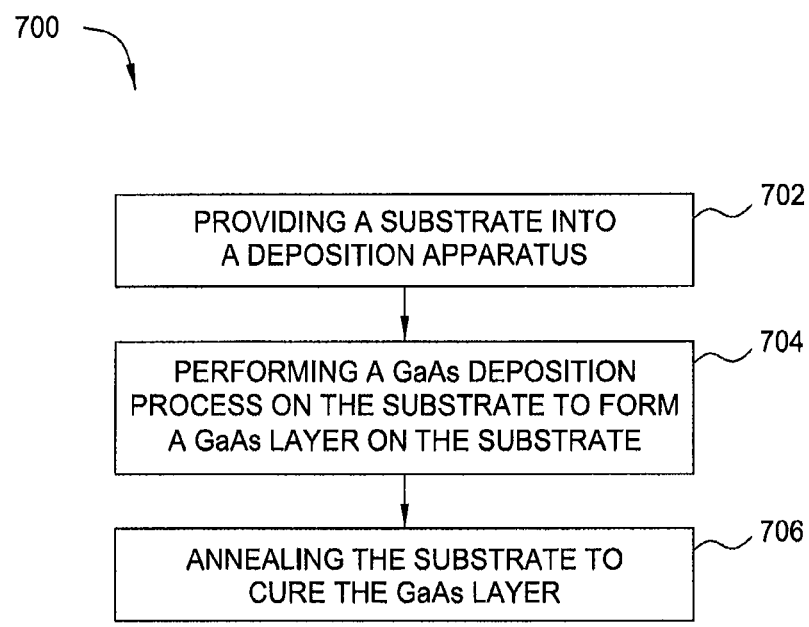
FIG. 7 is a flow chart of methods to manufacture a GaAs based solar cell according to embodiments of the invention.

FIG. 7 depicts a flow diagram of one embodiment of a processing sequence 700 for forming a solution based group III-V material, such as a solution based GaAs layer utilized in a thin film transistor device, such as the semiconductor layer 108, 206, 304, 412, 508, 606, or a doped semiconductor layer 110a, 110b, formed in the thin film transistor devices 100, 200, 300, 400, 500, 600 depicted in FIGS. 1-6. In the embodiment wherein the semiconductor layer 108, 206, 304, 412, 508, 606, or a doped semiconductor layer 110a, 110b, are configured as GaAs based materials, these layers may also be manufactured by the processing sequence 700 as depicted in FIG. 7. It is noted that FIG. 7 only depicts the process of manufacturing GaAs based layer for illustration purpose, and is not intended to limiting the invention scope or certain types of the layers that may be manufactured. It should be noted that the number and sequence of steps illustrated in FIG. 7 are not intended to limiting as to the scope of the invention described herein, since one or more steps can be added, deleted and/or reordered were appropriate without deviating from the basic scope of the invention described herein.

The processing sequence 700 begins at step 702 by providing a substrate, such as the substrate 102, 202, 302, 402, 502, 602, as shown in FIGS. 1-6, configured to form thin film transistor devices thereon. In one embodiment, the substrate 102 may be any one of glass substrate, plastic substrate, polymer substrate, metal substrate, singled substrate, roll-to-roll substrate, transparent substrate, silicon containing substrate, such as a single crystal silicon substrate, a multicrystalline silicon substrate, glass substrate, quartz substrate, or other suitable materials or other suitable transparent substrate suitable for forming a thin film transistor thereon. The substrate may have layers previously formed thereon to readily form a semiconductor layer 108, 206, 304, 412, 508, 606, or a doped semiconductor layer 110a, 110b, as the GaAs based layer.

At step 704, a GaAs deposition process is performed to deposit a GaAs layer on the substrate. The GaAs deposition process is performed by providing a pre-engineered solution based GaAs precursor to a processing chamber as a source precursor to facilitate depositing the GaAs layer as the semiconductor layer 108, 206, 304, 412, 508, 606, or a doped semiconductor layer 110a, 110b on the substrate 102.

The pre-engineered solution based GaAs precursor comprises a mixture of gallium complex and arsenic complex in solution, forming a gallium-arsenic complex in the solution. In one embodiment, the gallium-arsenic complex formed in the pre-engineered solution based GaAs precursor generally has a GaAs dimer (—GaAs—), a GaAs tetramer (—Ga$_2$As$_2$—), or a GaAs hexamer (—Ga$_3$As$_3$—) structure, as shown below.

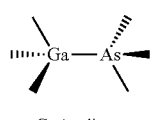

GaAs dimer (a)

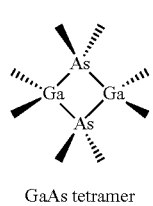

GaAs tetramer (b)

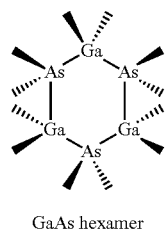

GaAs hexamer (c)

It is believed that GaAs dimer (—GaAs—), a GaAs tetramer (—Ga$_2$As$_2$—), or a GaAs hexamer (—Ga$_3$As$_3$—) structures are relatively stable complexes so make them as good candidates to be placed or stored in liquid solution under a relatively stable status. By utilizing this relatively stable solution based GaAs precursor, the GaAs solution may be delivered, injected, sprayed and coated onto the substrate with high uniformity and good film quality, thereby providing a reliable and repeatable GaAs layer with desired film properties and high film properties.

The GaAs dimer, GaAs tetramer, or GaAs hexamer may have different functional groups attached thereto to form the GaAs source precursor as a stable complex in the pre-engineered solution. The GaAs complex may have a formula $R_x(GaAs)_yR'_z$, wherein x, y, and z are integers having a range between 1 and 15, which R and R' may or may not be the same function groups or the like. The functional groups that may be attached to the Ga and As elements in the GaAs dimer, GaAs tetramer, or GaAs hexamer may include alkyl group, such as methyl (CH$_3$—), ethyl (C$_2$H$_5$—), propyl (C$_3$H$_7$—), butyl (C$_4$H$_9$—), pentyl (C$_5$H$_{11}$—), and so on, isopropyl and other similar isomers, aromatic groups, such as benzal, styrene, toluene, xylene, pyridine, ethylbenzene, acetophenone, methyl benzoate, phenyl acetate, phenol, cresol, furan, and the like, alicyclic group, such as cyclopropane, cyclobutane, cyclopentane, cyclopentadiene, toluene and the like, amino group, such as NR$_2$ (R as alkyl group), —SiR$_3$, —O—R, —S—R, —PR$_3$, —POR$_3$, halogens, 2,3,5,6-tetramethyl-1,4-benzoquinone or tetramethyl-p-benzoquinone, bidentate ligands, expedious ligands, amines pyranine, steric hindrance ligands and the like. In one exemplary embodiment, amino group, such as NR$_2$ (R as alkyl group) and steric hindrance ligands are selected as the functional groups attached to the GaAs dimer, GaAs tetramer, or GaAs hexamer.

The GaAs complex requires having a high solubility and stability in solution. Accordingly, the functional groups selected to form in the GaAs complex are desired to have 1:1 stoichiometry preactive or formed in clusters. Additionally, the functional groups are also desired to be able to be low temperature decomposed into GaAs. Furthermore, the bonding energy between the functional groups and Ga element and/or between the functional groups and As element is configured to be weaker than the bonding energy comprising the Ga—As bond. By this configuration, during a depositing reaction, the bonds between the functional groups and the Ga and/or As elements can be easily broken from the GaAs solution precursor, thereby assisting the formation of the GaAs layer on the substrate surface, and leaving GaAs bonding in the complex. As the functional groups as attached are selected to be easily removed, evaporated, or pyrolyzing during deposition or at the subsequent baking or curing process, a GaAs layer with minimum impurities or contamination may be thus obtained and formed on the substrate surface.

Suitable examples of the GaAs precursors that follows the requirements as stated above includes $(NMe_2)_2Ga_2As_2$ $(^tBuH)_2$, $Me_2GaAs(NMe_2)_2$, $Me_2GaAs(SiMePh_2)_2$, $Me_2GaAs(SiPh_3)_2$, $Et_2GaAs(SiMe_2Cy)_2$, $Me_2GaAs(SiMe_2Cy)_2$, $(Me)_3GaAs(NMe_2)_3$, $(Et)_3GaAs(NMe_2)_3$, $(Me)_4Ga_2As_2(^tBuH)_2$, $(Et)_4Ga_2As_2(^tBuH)_2$, 1:3 stoichiometry of Ga:As, such as $GaAs_3{^tBu_6}$, or the like. The structures of the GaAs precursors include the followings:

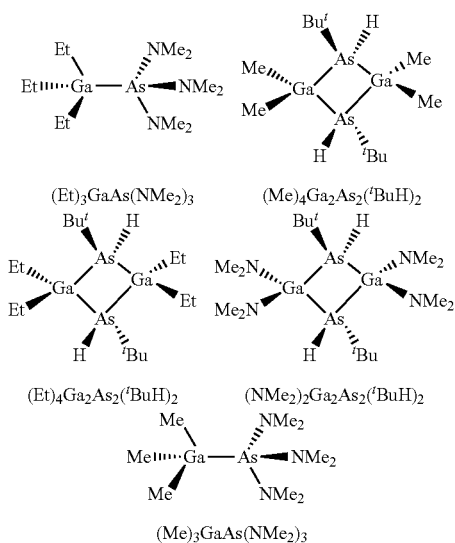

In one embodiment, the GaAs precursor used to form the GaAs layer on the substrate is $(NMe_2)_2GaAs^tBuH$. $(NMe_2)_2GaAs^tBuH$ precursor may be synthesized by mixing gallium amide $(Ga(NMe_2))_3$ with excess tert-butyl arsine $(^tBuAsH_2)$ in hexane or toluene solvent or other suitable organic or inorganic solvent and stirring overnight, such as stirring over 16 hours. The process temperature may be controlled between about −40 degrees Celsius and about −90 degrees Celsius. After the mixing process, $(NMe_2)_2GaAs^tBuH$ is obtained and may be stored in $CH_2Cl_2$ solvent or toluene solvent.

In another embodiment, the GaAs layer may be formed by using tris(dimethylamino)arsine $(Me_6N_3As)$ and trimethylgallium $(GaMe_3)$ as source precursors to synthesize and pre-engineer the GaAs source precursor. The tris(dimethylamino)arsine $(Me_6N_3As)$ and trimethylgallium $(GaMe_3)$ are reacted in toluene or hexane solvent to form the desired solution based GaAs containing precursor. The process temperature may be controlled between about −40 degrees Celsius and about −90 degrees Celsius.

In yet another embodiment, the GaAs layer may be formed by using $[\{L\}HGaAsR]_n$ or $[\{L\}_2GaAs^tBuH]$ as a precursor, in which L is nitrogen-based donor ligand, $NMe_2$, or hydrazines functional groups. The precursors of $[\{L\}HGaAsR]_n$ or $[\{L\}2GaAs^tBuH]$ may be synthesized by a reaction of $As(SiR_3)_3$, $R_3SiAsH_3$, or $H_2As^tBu$ with $GaH_3\{L\}$ or $Ga\{L\}_3$ in a hexane solution while stirring at room temperature for over 24 hours. After the reaction is completed, the $[\{L\}HGaAsR]_n$ or $[\{L\}_2GaAs^tBuH]$ precursor may be obtained and can be used as a source of GaAs to form the GaAs layer on the substrate when decomposed.

The GaAs containing precursor, such as $(NMe_2)_2GaAs^t$-BuH, $[\{L\}HGaAsR]_n$ or $[\{L\}_2GaAs^tBuH]$, or other suitable precursor as described above, is then supplied to a CVD chamber to deposit the GaAs layer on the substrate. In one embodiment, the solution based GaAs containing precursor is supplied in a CVD chamber to perform an aerosol assisted chemical vapor deposition (AACVD) process. An example of the AACVD chamber that may be used to practice the present invention will be further discussed below with referenced to FIG. 8. The precursor solution is atomized by using an aerosol generator. A carrier gas is used to promote aerosol formation. Subsequently, aerosol carrying the GaAs containing solvent precursor is transported into CVD chamber by the carrier gas and evaporated in the chamber. After entering into the CVD chamber, the precursor enters into the gas phase from the liquid phase to enable the CVD process. Subsequently, the gas phase GaAs containing precursor is then decomposed and absorbed on the substrate to form the desired GaAs layer on the substrate. If the precursor does not get full vaporization, spray pyrolysis process will take place to have the precursor become as aerosol droplets to be absorbed on the substrate and form the GaAs layer on the substrate surface. In one embodiment, during the AACVD deposition process, the substrate temperature is controlled at about 550 degrees Celsius so as to efficiently evaporate the precursor entering into the chamber.

In another embodiment, the GaAs layer may also be formed on the substrate by using aerojet, flash evaporation, laser assisted CVD, UV assisted CVD, laser reactive deposition, nanoparticles spray from solution, spray CVD, metalorganic vapour phase epitaxy (MOVPE), hydride vapor phase epitaxy (HVPE), or by other suitable techniques as needed. Some other wet deposition process, such as ink-jet, spin coating, meniscus coating, dip coating, electroplating, spray coating, electrospraying, screen printing or other suitable techniques may also employed to form the GaAs layer on the substrate surface. Furthermore, some vacuum techniques, such as molecular beam epitaxy (MBE), metalorganic vapour phase epitaxy (MOVPE), pulsed laser deposition (PLD), plasma enhanced chemical vapor deposition (PECVD), sputter, evaporate, magnetron sputter, chemical beam deposition, atomic layer deposition (ALD), hardware chemical vapor deposition (HWCVD), microwave plasma and some other techniques, may also used as needed.

After deposition, the GaAs layer is formed as a semiconductor layer in a thin film transistor device disposed on the substrate. The GaAs layer as formed on the substrate may have a ratio of Ga element to As element substantially between about 1:0.8 and about 1:1.2. XRD analysis indicates that the GaAs layer as formed has a strong (111) plane peak. The XRD peak positions, at <111>, <220> and <311> planes, match with the standard peak positions for cubic GaAs. In one embodiment, the GaAs layer may have a thickness between about 0.2 μm and about 3 μm.

In one embodiment, different dopants may be doped into the GaAs layer. Dopants may be in form of particles, powders, gel, liquid, solution or any other suitable forms, blending and mixing into the solution based GaAs pre-engineered precursor. Different dopants formed in the GaAs layer may provide different film conductivity and mobility, thereby increasing the electrical performance of the devices. In one embodiment, the dopants that may be doped into the GaAs layer include Al, Zn, Mg, In, P, Si, Se, S, C, N and the like. Suitable examples of p-type and n-type dopants may be mixed or blended into the GaAs precursor to form a doped GaAs solution based precursor, such as the p-type or n-type doped GaAs layers. Suitable examples of p-type dopants may be added into the GaAs precursor include metallic zinc dopants, dimethyl zinc (DMZ), diethyl zinc (DEZ), metallic magnesium dopants, cyclopentadienyl magnesium, carbon chlorine ($CCl_4$), carbon bromide ($CBr_4$) or the like. Suitable examples of n-type dopants include $H_2S$, sulfur, silane ($SiH_4$), disilane ($Si_2H_6$), $H_2Se$, Se or the like.

In one embodiment, the dopant concentration in the doped GaAs layer may be controlled at between about $1\times10^{16}$ atom/cm$^3$ and about $1\times10^{20}$ atom/cm$^3$. For example, in a p-type doped GaAs layer, the p-type dopants may be doped in the GaAs layer with a dopant concentration between about $1\times10^{17}$ atom/cm$^3$ and about $1\times10^{19}$ atom/cm$^3$. In another example, in a n-type doped GaAs layer, the n-type dopants may be doped in the GaAs layer with a dopant concentration between about $1\times10^{18}$ atom/cm$^3$ and about $1\times10^{20}$ atom/cm$^3$.

At step 706, after the GaAs layer is formed on the substrate, an anneal process is performed to thermally process the GaAs layer. It is noted that different types of post treatment processes, such as quenching, baking, laser treatment, or the like, may also be performed on the GaAs layer as needed. As the precursor utilized to form the GaAs layer contains elements other than Ga and As, such as carbon, nitrogen, oxide, or other elements contained in the precursor. The thermal annealing process and/or the post treatment process performed on the deposited layer may assist in the driving out of the impurities contained in the as-deposited GaAs layer. The thermal process may also assist in the repair of defects that may be formed in the as-deposited film during the deposition process.

In one embodiment, the annealing process may be performed by any suitable annealing tool, such as furnace, rapid thermal processing (RTP) chamber, spike anneal, or laser annealing chamber, and the like. The annealing process may be performed at a temperature between about 400 degrees Celsius and about 600 degree Celsius to assist in the densification and/or crystallization of the GaAs layer formed on the substrate.

Figure 8:
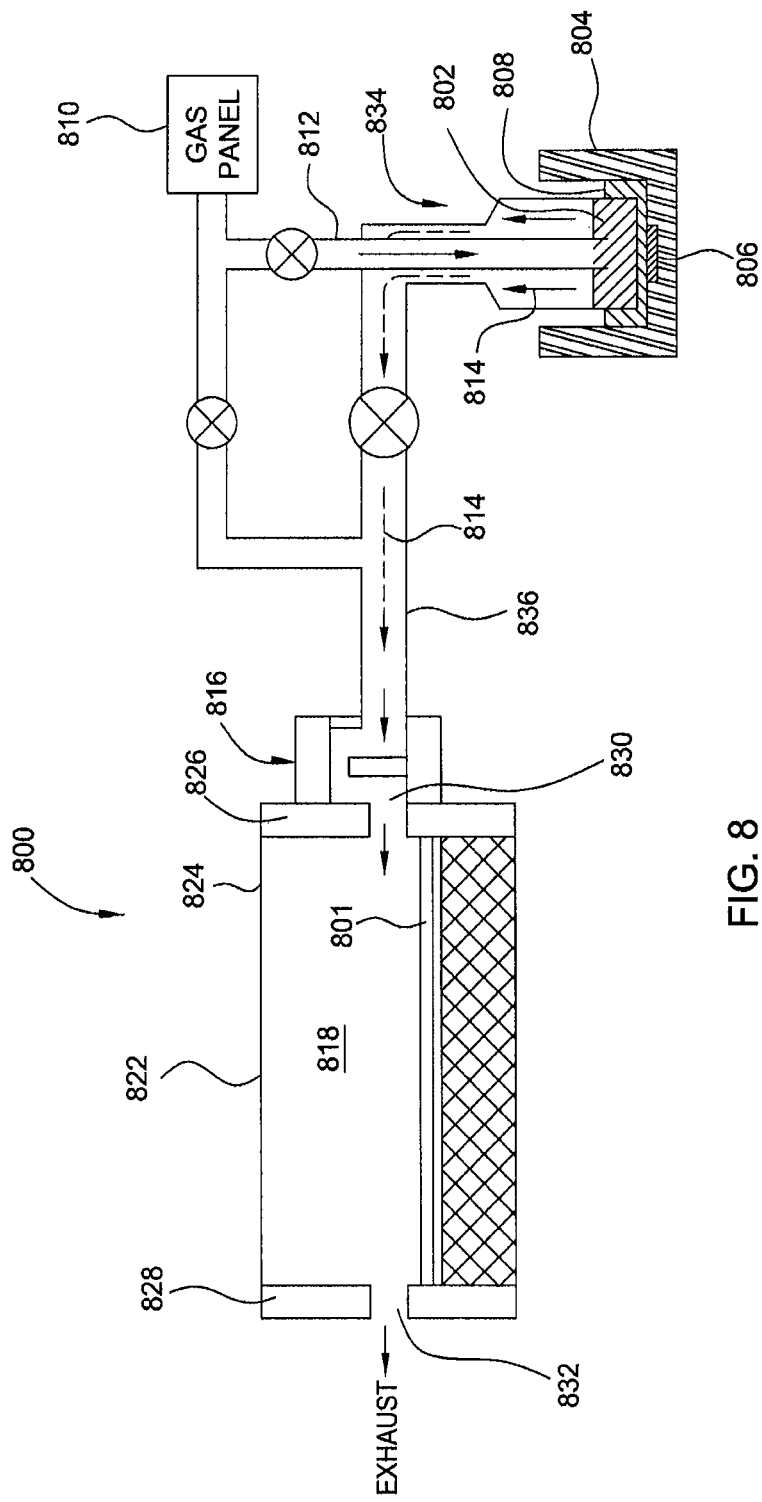
FIG. 8 depicts a simplified sectional perspective view of one embodiment of an aerosol assisted chemical vapor deposition (AACVD)

FIG. 8 depicts a simplified sectional perspective view of one embodiment of an aerosol assisted chemical vapor deposition (AACVD) chamber 800 that may be utilized to deposit a solution based GaAs layer on a substrate 801, such as the substrate 102, 202, 302, 402, 502, 602, described above with referenced to FIGS. 1-6. The AACVD chamber 800 may be used to perform a AACVD deposition process, such as the deposition process described above with referenced to FIG. 3. It is noted that other types of deposition process, such as MOCVD, aerojet, flash evaporation, laser assisted CVD, UV assisted CVD, laser reactive deposition, nanoparticles spray from solution, spray CVD, MOVPE, HVPE, or by other suitable techniques may be used to form the GaAs layer as needed. Some other wet deposition process, such as ink-jet, spin coating, meniscus coating, dip coating, electroplating, spray coating, electrospraying, screen printing or other suitable techniques may also employed to form the GaAs based layer on the substrate surface. Furthermore, some vacuum techniques, such as MBE, MOVPE, PLD, PECVD, sputter, evaporate, magnetron sputter, chemical beam deposition, ALD, HWCVD, microwave plasma and some other techniques, may also used as needed.

The chamber 800 includes a reaction tube 822 having a first wall 826, a second wall 828, and a reactor body 824 connecting between the first wall 826 and the second wall 828. The first wall 826, the second wall 828, and the reactor body 824 formed in the reaction tube 822 defines an interior processing region 818. A graphite heating block 820 is disposed in the reaction tube 822 to receive the substrate disposed thereon for processing. The temperature of the substrate may be monitored by a temperature sensor (not shown) disposed in the reaction tube 822 as needed.

An exhaust 832 is formed in the second wall 828 to facilitate transferring the substrate into and out of the reaction tube 822. A gas inlet port 830 is formed in the first wall 826 to facilitate delivering reaction gases and precursors into the interior processing region 818 during process from a mixing chamber 816. A liquid ampoule container 834 is attached to the mixing chamber 816 through a gas delivery passageway 836. The liquid ampoule container 834 may store precursors 808 to provide source materials into the interior processing region 818 to deposit a GaAs based layer based on the substrate. The mixing chamber 816 provides a tortuous path which may extend the flow path for the GaAs precursor 808 supplied from the liquid ampoule container 834 to ensure thorough mixing. Examples of GaAs precursor may be stored in the liquid ampoule container 834 include $(NMe_2)_2GaAs^tBuH$, $Me_2GaAs(NMe_2)_2$, $Me_2GaAs(SiMePh_2)_2$, $Me_2GaAs(SiPh_3)_2$, $Et_2GaAs(SiMe_2Cy)_2$, $Me_2GaAs(SiMe_2Cy)_2$, $(Me)_3GaAs(NMe_2)_3$, $(Et)_3GaAs(NMe_2)_3$, $(Me)_4Ga_2As_2(^tBuH)_2$, $(Et)_4Ga_2As_2(^tBuH)_2$, or the like.

In the embodiment wherein a doped GaAs based layer is desired to be formed on the substrate 102, such as a p-type doped GaAs based layer or a n-type doped GaAs based layer to form a doped semiconductor layer, such as the doped semiconductor layer 110a, 110b depicted in FIG. 1, dopant containing materials may be blended, added or mixed with the GaAs precursor in the liquid ampoule container 834, forming a dopant containing GaAs precursor which can be readily supplied to the interior processing region 818 for processing. As discussed above, suitable p-type dopant materials that may be added into the GaAs precursor include zinc containing materials, such as metallic zinc dopants, dimethyl zinc (DMZ), diethyl zinc (DEZ), or the like, magnesium containing material, such as metallic magnesium dopants, cyclopentadienyl magnesium, or the like, and carbon containing materials, such as carbon chlorine ($CCl_4$), carbon bromide ($CBr_4$) or the like. Suitable n-type dopant materials that may be added into the GaAs precursor include sulfur containing materials, such as $H_2S$, sulfur, silicon containing materials such as silane ($SiH_4$), disilane ($Si_2H_6$), and selenium containing material, such as $H_2Se$, Se or the like. In one embodiment, the p-type dopant materials utilized to be added to the GaAs precursor is DMZ or DEZ and n-type dopant materials utilized to be added to the GaAs precursor is disilane ($Si_2H_6$).

A gas panel 810 is coupled to the liquid ampoule container 834 to supply a carrier gas to the liquid ampoule container 834 through a delivery passageway 812. The gas panel 810 introduces carrier gases to the liquid ampoule container 834 to inject and push the GaAs precursor 802 disposed in the liquid ampoule container 834 to the mixing chamber 816 and ultimately into the interior processing region 818 through the gas delivery passageway 836. Examples of gases that may be supplied from the gas panel 810 include nitrogen containing gas, such as nitrogen ($N_2$), $N_2O$, and NO, among others, or oxygen containing gas, such as, oxygen ($O_2$) or ($O_3$). Inert gas, such as Ar or He, may also be used to carry the GaAs precursor 802 into the interior processing region 818. In one exemplary embodiment described herein, the carrier gas used to inject and push the GaAs precursor 808 to the interior processing region 818 is nitrogen ($N_2$) gas.

The solution based GaAs precursor 802 with/without the desired dopants disposed in the liquid ampoule container 834 is heated and vaporized by a humidifier 804. The humidifier 804 may have a piezoelectric device 806 which may provide ultrasonic energy and/or heat energy to the solution based GaAs precursor 802 disposed therein, thereby assisting heating and evaporating GaAs precursor 802 into gas phase or in form of tiny droplets for injection into the interior processing region 818 by the carrier gas, as shown by the arrow 814. Some liquid 808, such as water or other suitable liquid, may be disposed between the liquid ampoule container 834 and the humidifier to maintain the solution based GaAs precursor 802 within a desired temperature range. In one embodiment, the humidifier 804 may vaporize the GaAs precursor at a temperature between about 100 degrees Celsius and about 250 degrees Celsius.

Figure 9:
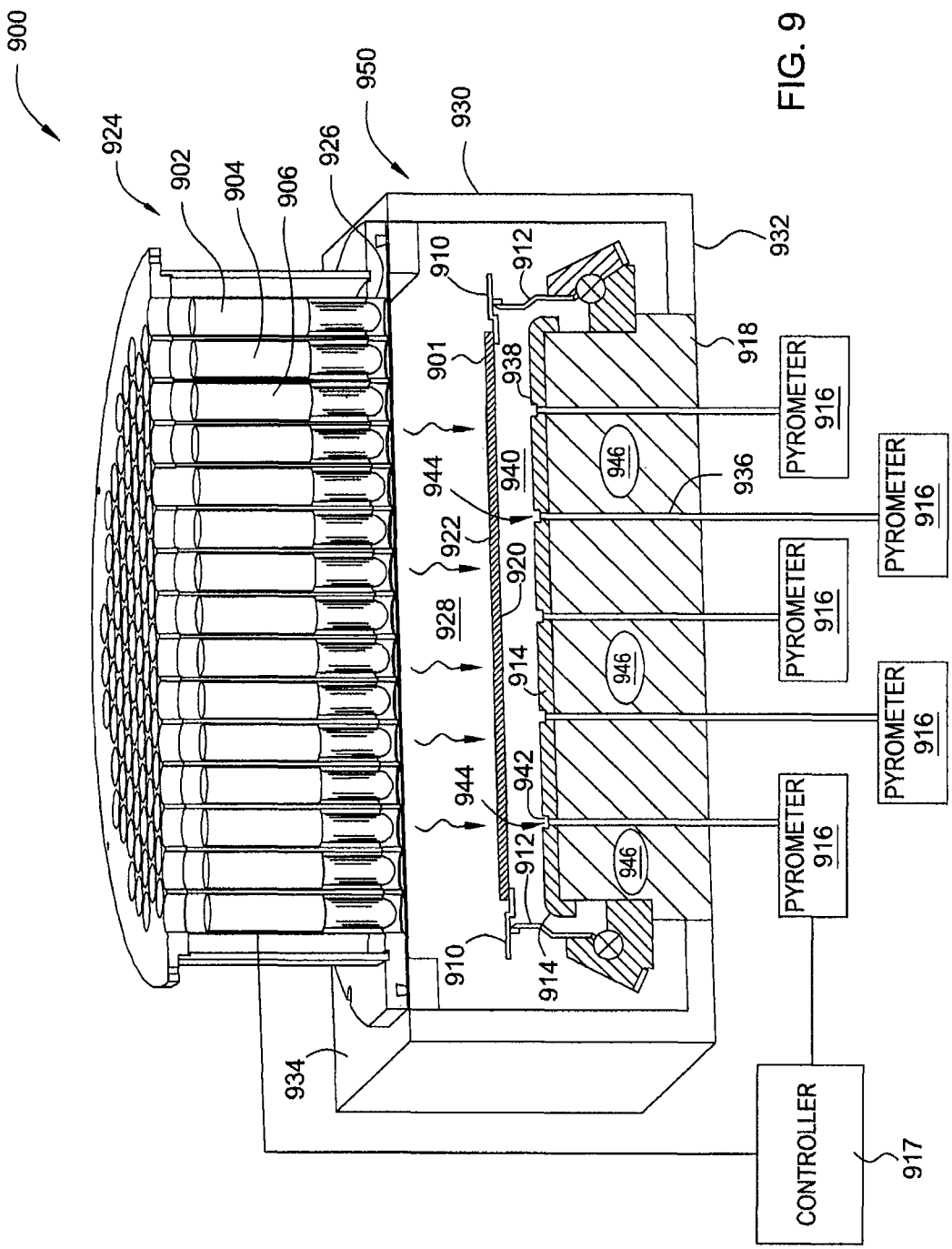
FIG. 9 depicts a simplified sectional perspective view of one embodiment of a rapid thermal processing chamber.

FIG. 9 depicts a simplified sectional perspective view of one embodiment of a rapid thermal processing chamber 900 that may be utilized to anneal a substrate 901, such as the substrate 102, 202, 302, 402, 502, 602 described above with referenced to FIGS. 1-6. The processing chamber 900 includes a chamber body 950 having chamber walls 930, a bottom 932, and a top 934 defining an interior volume 928. The walls 930 typically include at least one substrate access port (not shown) to facilitate entry and egress of the substrate 102, 202, 302, 402, 502, 602.

A radiant heat assembly 924 is mounted to the top 934 of the chamber body 950. The radiant heat assembly 924 is utilized to heat the substrate suspended by an edge ring 910 disposed around the periphery of the substrate. The radiant heat assembly 924 includes a plurality of lamp tubes 902 in a water jacket assembly 904. Each tube 902 contains a reflector and a tungsten halogen lamp assembly. The lamp tubes 902 are nested in a tight honeycomb pipe arrangement. This close-packed hexagonal arrangement of lamp tubes 902 provides radiant energy, such as an IR radiation and/or longer wavelength of UV radiation having a wavelength between about 400 nm and about 4000 nm with high-power density. In one embodiment, the radiant heat assembly 924 provides radiant energy to thermally process the substrate, such as annealing a silicon layer disposed on the substrate. One radiant heat assembly 924 that may be adapted to benefit from the invention is described in U.S. Pat. No. 5,487,127, issued Jan. 23, 1996 to Gronet, et al., and is hereby incorporated by reference in its entirety.

The edge ring 910 that supports substrate is spaced above a stainless steel base 918 by a rotatable quartz cylinder 912 mounted on the stainless steel base 918. The edge ring 910 may be fabricated from a hard material with a small coefficient of thermal expansion, such as silicon carbide, to prevent excessive expansion and contraction during thermal processing. The quartz cylinder 912 is rotated between about 50 rpm and about 300 rpm during substrate processing to maximize substrate temperature uniformity by minimizing the effect of thermal asymmetries in the chamber 900 and on the substrate. In one embodiment, the cylinder 912 may be coated with silicon to render the cylinder opaque to a desired wavelength. The stainless steel base 918 has a circulation circuit 946 allowing coolant, such as water, to circulate therethrough. The coolant circulation efficiently cools down the chamber temperature after processing.

A reflector plate 914 is disposed below the substrate and mounted above the stainless steel base 918. An array of temperature probes 944 is embedded in the reflector plate 914 through openings 942 defined therein. The temperature probes 944 are connected to pyrometers 916 through a conduit 936 that extends from the bottom side of the stainless steel base 918 to the openings 942 in the reflector plate 914. The temperature probes 944 and pyrometers 916 are used to obtain a metric indicative of temperatures of regions of the substrate proximate each probe 944 such that a temperature gradient of the substrate may be determined.

The bottom side 920 of the substrate and the upper side 938 of the reflector plate 914 bound a reflecting cavity 940 therebetween. The reflecting cavity 940 enhances the effective emissivity of the substrate, thereby improving the accuracy of the temperature measurement. A controller 917 may receive measurements from the pyrometers 916 and output control signals to radiant heat assembly 924 for real-time modify the radiation generated in the processing chamber 900, thereby maintaining the substrate temperature within a desired processing range.

The upper side 938 of the reflector plate 914 is highly reflective, and reflects thermal radiation in a target wavelength range and absorbs thermal radiation other then the target wavelength range. One or more coating or layers may be utilized to coat the reflector plate 914 on the stainless steel base 918 to provide the selective reflectivity. For example, different combination of coatings with different reflectivity and absorbability may be utilized to enable the reflector plate 914 to reflect thermal radiation at a desired wavelength back to the substrate and absorb (or less reflect) thermal radiation other than the desired wavelength. In one embodiment, the reflector plate 914 reflects the thermal wavelength between about 700 nm and about 1000 nm, and absorbs thermal wavelength below 700 nm and above 1000 nm. One reflector plate 914 that may be adapted to benefit from the invention is described in U.S. Pat. No. 6,839,507, issued Jan. 4, 2005 to Adams, et al., and is hereby incorporated by reference in its entirety.

The thermal energy not reflected to back to the substrate is absorbed by the reflector plate 914. The absorbed thermal energy is efficiently and rapidly removed by the coolant circulating through the stainless steel base 918 disposed below the reflector plate 914. Additionally, gas provided through holes (not shown) in the reflector plate 914 may be utilized to promote the cooling rate of the reflector plate 914 and the substrate positioned thereabove. The rapid cool down rate provided by the reflector plate 914 promotes the temperature control of the substrate, thereby efficiently providing a desired temperature processing profile. In one embodiment, the reflector plate 914 may provide a substrate cool date rate greater than about 200 degrees Celsius per second. In another embodiment, the reflector plate 914 may provide a substrate cool down rate of about 220 degrees Celsius per second.

Figure 10:
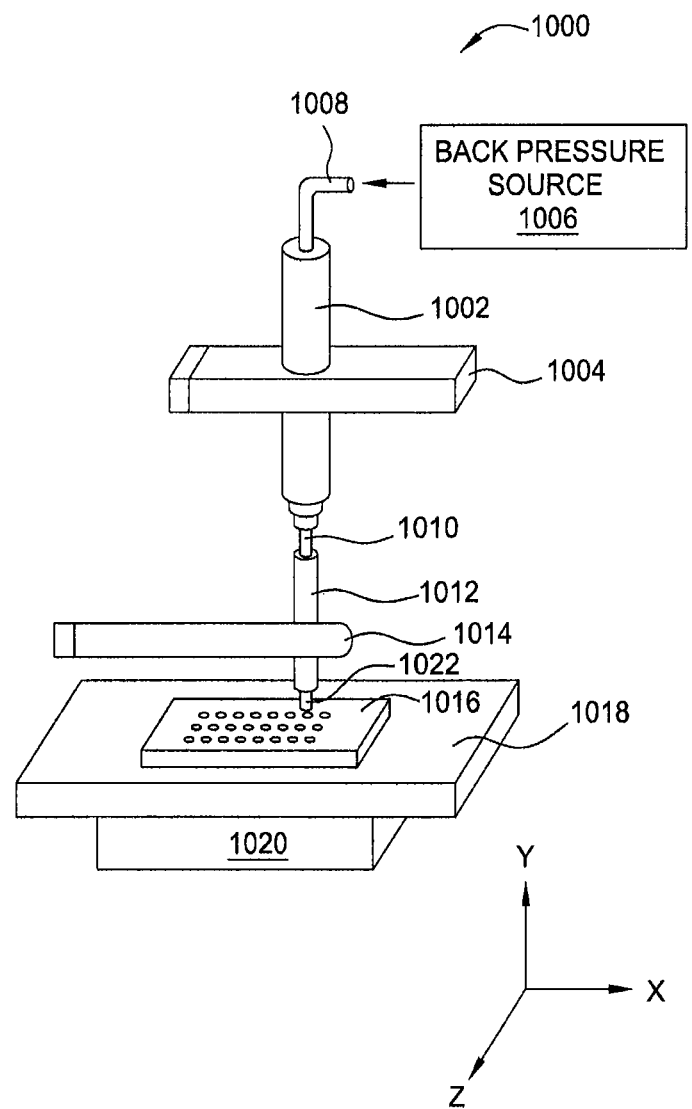
FIG. 10 depicts a simplified sectional perspective view of one embodiment of an electrohydrodynamic jet (E-jet) printing system.

FIG. 10 depicts a simplified sectional perspective view of one embodiment of an electrohydrodynamic jet (E-jet) printing system 1000. Electrohydrodynamic jet (E-jet) printing is a technique that uses electric fields to create fluid flow necessary to deliver ink and/or droplet to a substrate for high resolution (<30 μm). In one embodiment, the electrohydrodynamic jet (E-jet) printing is used herein to print a group III-V material, such as GaAs based droplets, on the backplanes for high performance thin film transistor (TFT) displays. The electrohydrodynamic jet (E-jet) printing utilized to print GaAs based droplets may also be used to create backplanes for OLED displays and high resolution, high frequency (3D) LCD TVs. The GaAs based droplets may use GaAs solution based precursor, as discussed above with referenced to FIG. 7, as the source material at relatively a low temperature. The high resolution of the electrohydrodynamic jet (E-jet) printing of the GaAs based droplets may be obtained due to a combination of nozzle sizes and droplet placement. The nozzle sizes may be varied to control the size of the droplets printed onto the substrate.

In one embodiment, the electrohydrodynamic jet (E-jet) printing system 1000 includes an ink chamber 1002 and an ink chamber holder 1004 utilized to hold and control the ink chamber 1002 at desired positions above a substrate 1016 disposed on a translation and tilting stage 1018. A stage heater 1020 may be attached to the translation and tilting stage 1018 to control the substrate 1016 at a desired temperature range. A micropipette 1010 is coupled to an end of the ink chamber 1002 to deliver the ink from the ink chamber 1002 to an nozzle 1022 attached to an end of a heater 1012 coupled between the micropipette 1010 and the nozzle 1022. The heater 1012 may be a NiCr heater configured to maintain the ink delivered therethrough at a desired temperature range not to clog the delivery path. The stage 1018 may be moved relative to the tip of the nozzle 1022. The stage 1018 may be controlled to have a scan speed at a desired range. In addition, the stage 1018 may be controlled to move relative to the nozzle 1022 along a periphery region or center region of the substrate 1016 to inject ink to desired locations defined on the substrate surface. In one embodiment, the stage 1018 may be moved at a constant speed, an accelerated speed or moved other paths as desired. Any suitable translation mechanism may be used, such as a conveyor system, rack and pinion system, or an x/y actuator, a robot, or other suitable mechanism, to accurate movement of the stage 1018.

A back pressure source 1006 is coupled to a conduit 1008 attached to the ink chamber 1002 configured to apply a back pressure to the nozzle 1022. Different pressure as applied may have different amount of ink injected onto the substrate surface as needed. Furthermore, change in back pressure and voltage as applied to the nozzle 1022 may also affect the size and frequency of the ink droplets. In one embodiment, the GaAs solution based precursor, as discussed above with referenced to FIG. 7, may be stored in the ink chamber 1002 configured to be printed or injected onto the substrate as needed. In operation, a voltage power may be applied between the nozzle 1022 and the substrate to create an electric field so as to maintain and control consistent jetting conditions. In one embodiment, the printed GaAs droplets may have an average measured diameter between about 1 µm and about 10 µm.

While the foregoing is directed to embodiments of the present invention, other and further embodiments of the invention may be devised without departing from the basic scope thereof, and the scope thereof is determined by the claims that follow.

What is claimed is:

1. A method of forming a thin film transistor structure, comprising:
   transferring a substrate having a dielectric layer disposed thereon into a processing chamber,
   supplying a GaAs containing precursor disposed in a solvent to the processing chamber;
   evaporating the GaAs containing precursor solvent in the processing chamber to form a GaAs based layer on the substrate; and
   forming a source-drain metal electrode layer adjacent to the GaAs based layer to form a thin film transistor structure.

2. The method of claim 1, wherein the GaAs containing precursor is selected from a group consisting of $(NMe_2)_2GaAs^tBuH$, $Me_2GaAs(NMe_2)_2$, $Me_2GaAs(SiMePh_2)_2$, $Me_2GaAs(SiPh_3)_2$, $Et_2GaAs(SiMe_2Cy)_2$, and $Me_2GaAs(SiMe_2Cy)_2$.

3. The method of claim 1, wherein evaporating the GaAs containing precursor solvent further comprises:
   annealing the GaAs based layer formed on the substrate.

4. The method of claim 1, further comprising:
   forming a doped GaAs layer on the GaAs based layer prior to forming the source-drain metal electrode layer.

5. The method of claim 4, wherein the doped GaAs layer includes a p-type dopant or a n-type dopant formed therein.

6. The method of claim 5, wherein the p-type dopant is selected from a group consisting of metallic zinc dopants, dimethyl zinc (DMZ), diethyl zinc (DEZ), metallic magnesium dopants, cyclopentadienyl magnesium, carbon chlorine ($CCl_4$) or carbon bromide ($CBr_4$), and the n-type dopant is selected from a group consisting of $H_2S$, sulfur, silane ($SiH_4$), disilane ($Si_2H_6$), $H_2Se$ and Se.

7. The method of claim 1, wherein the source-drain metal electrode layer is fabricated by a metallic material selected from a group consisting of copper (Cu), gold (Au), silver (Ag), aluminum (Al), tungsten (W), molybdenum (Mo), chromium (Cr), tantalum (Ta), cobalt (Co), germanium (Ge), tantalum (Ta), titanium (Ti), gold (Au), alloy of titanium (Ti) and gold (Au), alloy of tantalum (Ta) and gold (Au), alloy of germanium (Ge) and gold (Au), alloy of aluminum (Al) and cobalt (Co), composite layers including a film stack having aluminum layer (Al) sandwiched between molybdenum (Mo), alloys thereof and combination thereof.

8. A method for forming a GaAs based material in a thin film transistor structure further comprising:
   forming a semiconductor layer on a dielectric layer disposed on a substrate, wherein the semiconductor layer is fabricated from a solution based GaAs based layer; and
   forming a source-drain metal electrode layer adjacent to the semiconductor layer.

9. The method of claim 8, further comprising:
   forming a doped semiconductor layer between the semiconductor layer and the source-drain metal electrode layer.

10. The method of claim 8, wherein the solution based GaAs based layer is fabricated from a GaAs containing precursor is selected from a group consisting of $(NMe_2)_2GaAs^tBuH$, $Me_2GaAs(NMe_2)_2$, $Me_2GaAs(SiMePh_2)_2$, $Me_2GaAs(SiPh_3)_2$, $Et_2GaAs(SiMe_2Cy)_2$, and $Me_2GaAs(SiMe_2Cy)_2$.

11. The method of claim 9, wherein the doped semiconductor layer includes a p-type dopant or a n-type dopant formed therein.

12. The method of claim 11, wherein the p-type dopant is selected from a group consisting of metallic zinc dopants, dimethyl zinc (DMZ), diethyl zinc (DEZ), metallic magnesium dopants, cyclopentadienyl magnesium, carbon chlorine ($CCl_4$) or carbon bromide ($CBr_4$), and the n-type dopant is selected from a group consisting of $H_2S$, sulfur, silane ($SiH_4$), disilane ($Si_2H_6$), $H_2Se$ and Se.

13. A method for forming a GaAs based material on a substrate, comprising:
   providing a substrate into a electrohydrodynamic jet system; and
   printing a plurality of GaAs droplets onto the substrate, wherein the GaAs droplets are supplied from a solution based GaAs precursor disposed in the system.

* * * * *

UNITED STATES PATENT AND TRADEMARK OFFICE
CERTIFICATE OF CORRECTION

| | | |
|---|---|---|
| PATENT NO. | : 9,780,223 B2 | Page 1 of 1 |
| APPLICATION NO. | : 15/210637 | |
| DATED | : October 3, 2017 | |
| INVENTOR(S) | : Kaushal K. Singh et al. | |

It is certified that error appears in the above-identified patent and that said Letters Patent is hereby corrected as shown below:

In the Specification

In Column 4, Line 15, before "cobalt" delete "tantalum (Ta),".

In Column 8, Line 42, delete "expedious" and insert -- expeditious --, therefor.

In Column 9, Line 57, delete "[{L}2" and insert -- [{L}$_2$ --, therefor.

In Column 14, Line 13, delete "then" and insert -- than --, therefor.

In the Claims

In Column 16, Line 20, in Claim 7, before "cobalt" delete "tantalum (Ta),".

Signed and Sealed this
Twenty-first Day of November, 2017

Joseph Matal
*Performing the Functions and Duties of the*
*Under Secretary of Commerce for Intellectual Property and*
*Director of the United States Patent and Trademark Office*